United States Patent
Liu et al.

(10) Patent No.: US 10,948,527 B2
(45) Date of Patent: Mar. 16, 2021

(54) POWER SYSTEM DETECTION OF SUSTAINED OSCILLATIONS BASED ON SYNCHROPHASOR FREQUENCY MEASUREMENTS

(71) Applicant: University of Tennessee Research Foundation, Knoxville, TN (US)

(72) Inventors: Yilu Liu, Knoxville, TN (US); Ling Wu, Andover, MA (US); Wenpeng Yu, Knoxville, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 8 days.

(21) Appl. No.: 16/418,377

(22) Filed: May 21, 2019

(65) Prior Publication Data
US 2020/0371142 A1 Nov. 26, 2020

(51) Int. Cl.
*G01R 25/00* (2006.01)
*H02J 3/46* (2006.01)
*G01R 23/02* (2006.01)

(52) U.S. Cl.
CPC ............. *G01R 25/00* (2013.01); *G01R 23/02* (2013.01); *H02J 3/46* (2013.01)

(58) Field of Classification Search
CPC ............ G01R 23/02; G01R 25/00; H02J 3/46
USPC .................................................. 307/11, 43, 80
See application file for complete search history.

(56) References Cited

U.S. PATENT DOCUMENTS

| | | | |
|---|---|---|---|
| 2009/0088988 A1* | 4/2009 | Muthu-Mannivannan | G01R 31/1227 702/58 |
| 2015/0121160 A1* | 4/2015 | Baone | G06F 11/1415 714/746 |
| 2020/0052657 A1* | 2/2020 | Zhu | H03G 3/3042 |

OTHER PUBLICATIONS

Ghorbaniparvar, Mohammadreza, "Survey on forced oscillations in power system", Journal of Modern Power Systems and Clean Energy; 5(5), 2017, 671-682.

(Continued)

*Primary Examiner* — William Hernandez
(74) *Attorney, Agent, or Firm* — Myers Bigel, P.A

(57) ABSTRACT

A method includes performing by a processor: receiving a plurality of power system phase angle measurements over a time interval from a plurality of phasor measurement units (PMUs) in a power system, generating a phase angle curve over the time interval based on the plurality of power system phase angle measurements, and detecting a sustained oscillation event in a power signal generated by the power system based on an envelope of the phase angle curve.

20 Claims, 9 Drawing Sheets

(56) References Cited

OTHER PUBLICATIONS

Sarmadi, S. Arash Nezam, et al., "Inter-Area Resonance in Power Systems From Forced Oscillations", IEEE Transactions on Power Systems, 31(1), 2016, 378-386.
Trudnowski, Daniel, et al., "Shape Properties of Forced Oscilations", 2016 North American Power Symposium (NAPS), Sep. 18-20, 2016, 5 pp.
Vanfretti, Luigi, et al., "Effects of Forced Oscillations in Power System Damping Estimation", 2012 IEEE International Workshop on Applied Measurements for Power Systems (AMPS) Proceedings, Sep. 26-28, 2012, 2012, 7 pp.
Yang, Dong, et al., "Response analysis and type discrimination of power system forced oscillation", 2015 5th International Conference on Electric Utility Deregulation and Restructuring and Power Technologies (DRPT), 2015, 5 pp.
Ye, Hua, et al., "Analysis and Detection of Forced Oscillation in Power System", IEEE Transactions on Power Systems, 32(2), 2017, 1149-1160.
Zhou, Ning, et al., "Locating sources of forced oscillations using transfer functions", 2017 IEEE Power and Energy Conference at Illinois (PECI), Feb. 23-24, 2017, 8 pp.

\* cited by examiner

POWER SYSTEM DETECTION OF SUSTAINED OSCILLATIONS BASED ON SYNCHROPHASOR FREQUENCY MEASUREMENTS

STATEMENT REGARDING FEDERALLY SPONSORED RESEARCH OR DEVELOPMENT

This invention was made with government support under contract number NSF EEC-1041877 awarded by the National Science Foundation. The government has certain rights in the invention.

BACKGROUND

The present disclosure relates to power systems, and, in particular, to monitoring of power systems and frequency regulation of power systems.

The frequency of a power system may be affected by the balance between power generation and load consumption. Power consumption and/or power generation may both vary, which may result in the two rarely being precisely in balance. During normal operation, changes in frequency may be controlled by ancillary services that provide continuous, automatic frequency control through automatic generator control (AGC). However, severe electromechanical disturbances, such as generation trip and load reduction, can cause significant drops and/or increases in system frequency and may influence the dynamic behavior of a power grid. Therefore, it is generally desirable to prevent and/or reduce large deviations of the power system frequency from the nominal frequency during large disturbances and so as to improve the operational stability of power systems.

Modern power systems are progressively more interconnected on transmission networks and more interactive with distributed renewable power generation sources in distribution networks due to increasing power demand. This situation may create more technical challenges in the context of oscillations. Sustained oscillations have emerged as a threat to the operation stability of power grids worldwide. In addition the conventional poorly or negatively damped oscillations caused by insufficient system damping, there are forced oscillations caused by small and periodic external faults. The properties and behaviors of these two oscillations are well established in the literature. If the electromechanical eigenvalues of the power system are stable, the conventional oscillations will typically damp and the system will converge to a new stable status. These events may be called "natural oscillation" events. Actions can be taken to suppress the natural oscillations, such as installing a Power System Stabilizer (PSS), constructing new transmission lines, reducing gains of exciters on strongly related generators, etc. "Forced oscillation" refers to a type of system response to cyclic inputs often brought about by prime mover pressure pulsation, malfunction of a PSS, periodic load disturbances, etc. Forced oscillations generally respond to the disturbances quickly, and typically terminate immediately once the disturbances are withdrawn. Besides zero or negative damping natural oscillations and large magnitude forced oscillations, small cyclic input that coincides at a node nearby a weakly damped system node may result in resonance causing the generation of an output at a much larger magnitude than the input, which may be a threat to the stable operation of a power system.

SUMMARY

In some embodiments of the inventive subject matter, a method comprises performing by a processor: receiving a plurality of power system phase angle measurements over a time interval from a plurality of phasor measurement units (PMUs) in a power system, generating a phase angle curve over the time interval based on the plurality of power system phase angle measurements, and detecting a sustained oscillation event in a power signal generated by the power system based on an envelope of the phase angle curve.

In other embodiments, detecting the sustained oscillation event comprises detecting the sustained oscillation event based on a magnitude of the envelope of the phase angle curve.

In still other embodiments, detecting the sustained oscillation event based on the magnitude of the envelope of the phase angle curve comprises: determining a maximum peak-to-peak magnitude of the envelope of the phase angle curve, comparing the maximum peak-to-peak magnitude of the envelope of the phase angle curve to a threshold, and detecting the sustained oscillation event based on the maximum peak-to-peak magnitude of the envelope of the phase angle curve exceeding the threshold.

In still other embodiments, detecting the sustained oscillation event comprises detecting the sustained oscillation event based on a damping of the envelope of the phase angle curve.

In still other embodiments, detecting the sustained oscillation event based on the damping of the envelope of the phase angle curve comprises determining a first peak-to-peak magnitude of the envelope of the phase angle curve for a first cycle of the phase angle curve, determining a second peak-to-peak magnitude of the envelope of the phase angle curve for a second cycle of the phase angle curve occurring later in time than the first cycle of the phase angle curve, determining a ratio of the second peak-to-peak magnitude to the first peak-to-peak magnitude, comparing the ratio to a threshold, and detecting the sustained oscillation event based on the ratio exceeding the threshold.

In still other embodiments, detecting the sustained oscillation event comprises detecting the sustained oscillation event based on a magnitude of the envelope of the phase angle curve exceeding a magnitude threshold for a time duration that exceeds time duration threshold.

In still other embodiments, the method further comprises determining a probability density function of the magnitude of the envelope of the phase angle curve. The magnitude threshold corresponds to a magnitude value of the envelope of the phase angle curve greater that is greater than other magnitude values of the envelope of the phase angle curve with a probability of about 99.5%.

In still other embodiments, the method further comprises adjusting an assignment of a power generator to a load in the power system based on the sustained oscillation event.

In further embodiments of the inventive subject matter, a system comprises a processor and a memory coupled to the processor and comprising computer readable program code embodied in the memory that is executable by the processor to perform operations comprising: receiving a plurality of power system phase angle measurements over a time interval from a plurality of phasor measurement units (PMUs) in a power system, generating a phase angle curve over the time interval based on the plurality of power system phase angle measurements, and detecting a sustained oscillation event in a power signal generated by the power system based on an envelope of the phase angle curve.

In still further embodiments, detecting the sustained oscillation event comprises detecting the sustained oscillation event based on a magnitude of the envelope of the phase angle curve.

In still further embodiments, detecting the sustained oscillation event based on the magnitude of the envelope of the phase angle curve comprises determining a maximum peak-to-peak magnitude of the envelope of the phase angle curve, comparing the maximum peak-to-peak magnitude of the envelope of the phase angle curve to a threshold, and detecting the sustained oscillation event based on the maximum peak-to-peak magnitude of the envelope of the phase angle curve exceeding the threshold.

In still further embodiments, detecting the sustained oscillation event comprises detecting the sustained oscillation event based on a damping of the envelope of the phase angle curve.

In still further embodiments, detecting the sustained oscillation event based on the damping of the envelope of the phase angle curve comprises determining a first peak-to-peak magnitude of the envelope of the phase angle curve for a first cycle of the phase angle curve, determining a second peak-to-peak magnitude of the envelope of the phase angle curve for a second cycle of the phase angle curve occurring later in time than the first cycle of the phase angle curve, determining a ratio of the second peak-to-peak magnitude to the first peak-to-peak magnitude, comparing the ratio to a threshold, and detecting the sustained oscillation event based on the ratio exceeding the threshold.

In still further embodiments, detecting the sustained oscillation event comprises detecting the sustained oscillation event based on a magnitude of the envelope of the phase angle curve exceeding a magnitude threshold for a time duration that exceeds time duration threshold.

In still further embodiments, the operations further comprise adjusting an assignment of a power generator to a load in the power system based on the sustained oscillation event.

In other embodiments of the inventive subject matter, a computer program product comprises a tangible computer readable storage medium comprising computer readable program code embodied in the medium that is executable by a processor to perform operations comprising: receiving a plurality of power system phase angle measurements over a time interval from a plurality of phasor measurement units (PMUs) in a power system, generating a phase angle curve over the time interval based on the plurality of power system phase angle measurements, and detecting a sustained oscillation event in a power signal generated by the power system based on an envelope of the phase angle curve.

In still other embodiments, detecting the sustained oscillation event comprises detecting the sustained oscillation event based on a magnitude of the envelope of the phase angle curve.

In still other embodiments, detecting the sustained oscillation event comprises detecting the sustained oscillation event based on a damping of the envelope of the phase angle curve.

In still other embodiments, detecting the sustained oscillation event comprises detecting the sustained oscillation event based on a magnitude of the envelope of the phase angle curve exceeding a magnitude threshold for a time duration that exceeds time duration threshold.

In still other embodiments, the operations further comprise adjusting an assignment of a power generator to a load in the power system based on the sustained oscillation event.

Other methods, systems, articles of manufacture, and/or computer program products, according to embodiments of the inventive subject matter, will be or become apparent to one with skill in the art upon review of the following drawings and detailed description. It is intended that all such additional systems, methods, articles of manufacture, and/or computer program products be included within this description, be within the scope of the present inventive subject matter, and be protected by the accompanying claims.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

As used herein, the term "data processing facility" includes, but it is not limited to, a hardware element, firmware component, and/or software component. A data processing system may be configured with one or more data processing facilities.

As used herein, the term "real-time" may mean an operation is performed without inserting any artificial scheduling or processing delays.

Some embodiments of the inventive subject matter may stem from a realization that sustained oscillation has been recognized as one of the top threats to power system stability even though the sustained oscillation events may occur less frequently than trips of devices and/or transmission lines. Embodiments of the inventive subject matter may detect signatures indicative of sustained oscillation based on synchronous frequency measurements obtained from one or more phasor measurement units (PMUs) in a power system. In contrast to other approaches, real-time detection of sustained oscillation based on synchrophasor measurements may allow sustained oscillation events to be detected when active power measurements are not available. Sustained oscillation may be identified using signatures based on 1) generally large magnitude, 2) generally poor damping, and 3) generally long-lasting duration. Some embodiments of the inventive subject matter detects one or more of these sustained oscillation signatures based on the phase angle frequency envelope and determine and/or define the thresholds used in evaluating whether the frequency envelope expresses one or more sustained oscillation signatures according to the real-time statistics of frequency variations. An additional confirmation of whether the frequency enveloped is indicative of a sustained oscillation event may be generated based on a periodogram or power-spectral density analysis presents noticeably high energy at a certain frequency, which indicates the dominant mode of the sustained oscillation and the magnitude of the oscillations.

Figure 1:
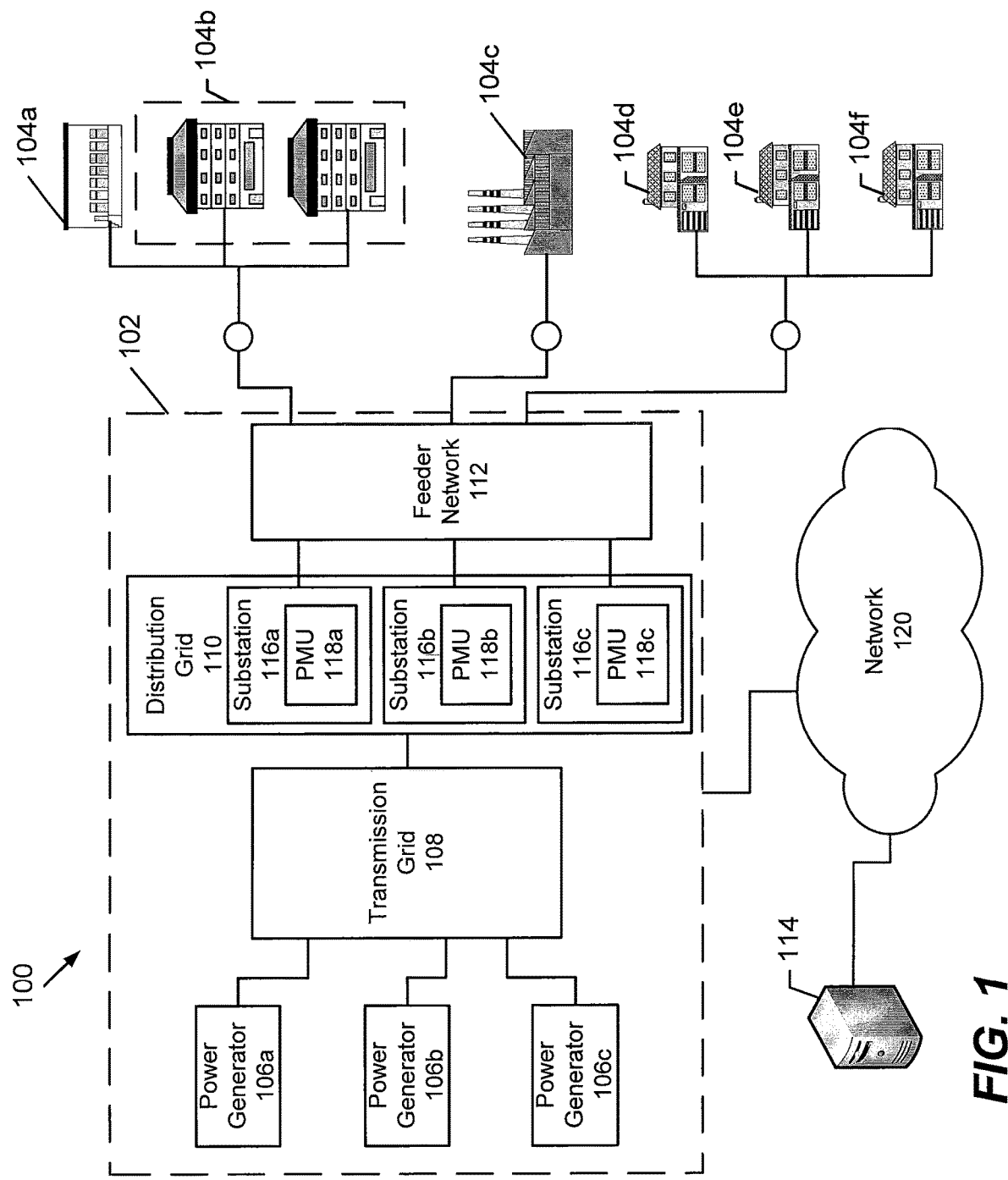
FIG. 1 is a block diagram that illustrates a power distribution network including a sustained oscillation detection capability in accordance with some embodiments of the inventive subject matter.

Referring to FIG. 1, a power system distribution network 100 including sustained oscillation detection capability, in accordance with some embodiments of the inventive subject matter, comprises a main power grid 102, which is typically operated by a public or private utility, and which provides power to various power consumers 104a, 104b, 104c, 104d, 104e, and 104f. The electrical power generators 106a, 106b, and 106c are typically located near a fuel source, at a dam site, and/or at a site often remote from heavily populated areas. The power generators 106a, 106b, and 106c may be nuclear reactors, coal burning plants, hydroelectric plants, and/or other suitable facility for generating bulk electrical power. The power output from the power generators 106, 106b, and 106c is carried via a transmission grid or transmission network over potentially long distances at relatively high voltage levels. A distribution grid 110 may comprise multiple substations 116a, 116b, 116c, which receive the power from the transmission grid 108 and step the power down to a lower voltage level for further distribution. A feeder network 112 distributes the power from the distribution grid 110 substations 116a, 116b, 116c to the power consumers 104a, 104b, 104c, 104d, 104e, and 104f. The power substations 116a, 116b, 116c in the distribution grid 110 may step down the voltage level when providing the power to the power consumers 104a, 104b, 104c, 104d, 104e, and 104f through the feeder network 112.

As shown in FIG. 1, the power consumers 104a, 104b, 104c, 104d, 104e, and 104f may include a variety of types of facilities including, but not limited to, a warehouse 104a, a multi-building office complex 104b, a factory 104c, and residential homes 104d, 104e, and 104f. A feeder circuit may connect a single facility to the main power grid 102 as in the case of the factory 104c or multiple facilities to the main power grid 102 as in the case of the warehouse 104a and office complex 104b and also residential homes 104d, 104e, and 104f. Although only six power consumers are shown in FIG. 1, it will be understood that a feeder network 112 may service hundreds or thousands of power consumers.

The power distribution network 100 further comprises a Distribution Management System (DMS) 114, which may monitor and control the generation and distribution of power via the main power grid 102. The DMS 114 may comprise a collection of processors and/or servers operating in various portions of the main power grid 102 to enable operating personnel to monitor and control the main power grid 102. The DMS 114 may further include other monitoring and/or management systems for use in supervising the main power grid 102. One such system is known as the Supervisory Control and Data Acquisition (SCADA) system, which is a control system architecture that uses computers, networked data communications, and graphical user interfaces for high-level process supervisory management of the main power grid.

According to some embodiments of the inventive subject matter, PMUs 118a, 118b, and 118c may be located at the substations 116a, 116b, and 116c, respectively. PMUs measure current and voltage by amplitude and phase at selected stations of the distribution grid 110. Using Global Positioning System (GPS) information, for example, high-precision time synchronization may allow comparing measured values (synchrophasors) from different substations distant to each other and drawing conclusions regarding the system state and dynamic events, such as power swing conditions. The PMUs 118a, 118b, 118c may determine current and voltage phasors, frequency, and rate of change of frequency and provide these measurements with time stamps for transmittal to the DMS 114 for analysis. The PMUs 118a, 118b, 118c may communicate with the DMS 114 over the network 120. The network 120 may be a global network, such as the Internet or other publicly accessible network. Various elements of the network 120 may be interconnected by a wide area network, a local area network, an Intranet, and/or other private network, which may not be accessible by the general public. Thus, the communication network 120 may represent a combination of public and private networks or a virtual private network (VPN). The network 120 may be a wireless network, a wireline network, or may be a combination of both wireless and wireline networks. Although the PMUs 118a, 118b, and 118c are shown as being located in the substations 116a, 116b, and 116c, it will be understood that the PMUs may be located in other locations within the distribution grid 110, within the main power grid 102, or even at consumer locations 104a, 104b, 104c, 104d, 104e, and 104f, such as, for example, in proximity to wall outlets or other power access points.

Although FIG. 1 illustrates an exemplary a power distribution network 100 including a sustained oscillation detection capability, it will be understood that embodiments of the inventive subject matter are not limited to such configurations, but are intended to encompass any configuration capable of carrying out the operations described herein.

Figure 2:
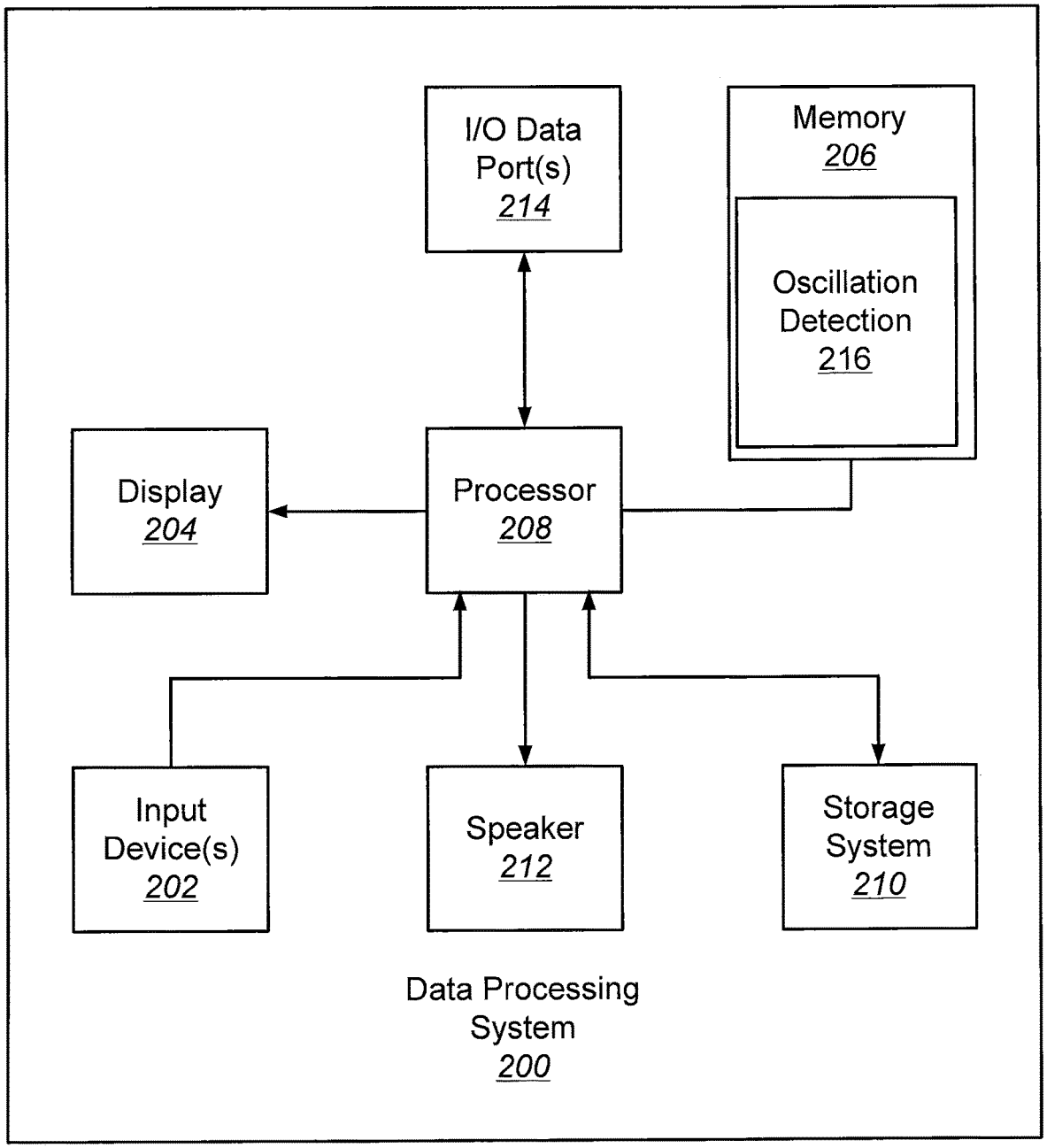
FIG. 2 illustrates a data processing system that may be used to implement a Distribution Management System (DMS) processor associated with a power system of FIG. 1 in accordance with some embodiments of the inventive subject matter.

Referring now to FIG. 2, a data processing system 200 that may be used to implement the DMS 114 processor of FIG. 1, in accordance with some embodiments of the inventive subject matter, comprises input device(s) 202, such as a keyboard or keypad, a display 204, and a memory 206 that communicate with a processor 208. The data processing system 200 may further include a storage system 210, a speaker 212, and an input/output (I/O) data port(s) 214 that also communicate with the processor 208. The storage system 210 may include removable and/or fixed media, such as floppy disks, ZIP drives, hard disks, or the like, as well as virtual storage, such as a RAMDISK. The I/O data port(s) 214 may be used to transfer information between the data processing system 200 and another computer system or a network (e.g., the Internet). These components may be conventional components, such as those used in many conventional computing devices, and their functionality, with respect to conventional operations, is generally known to those skilled in the art. The memory 206 may be configured with sustained oscillation detection module 216 that may provide functionality that may include, but is not limited to, detecting sustained oscillation events based on synchronous frequency measurements obtained from one or more PMUs 118a, 118b, and 118c in accordance with some embodiments of the inventive subject matter.

Figure 3:
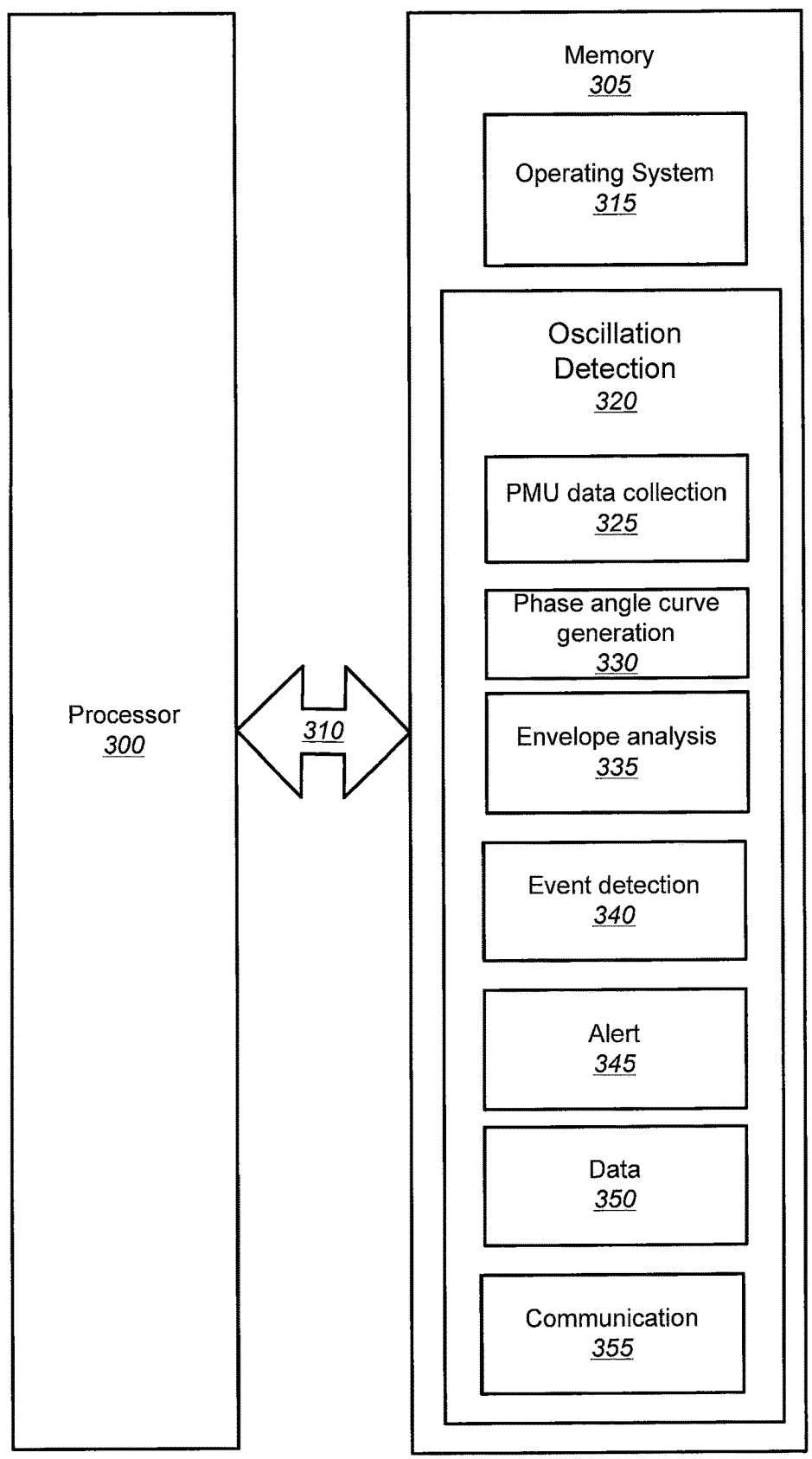
FIG. 3 is a block diagram that illustrates a software/hardware architecture for use in a DMS processor for detecting sustained oscillations in a power system in accordance with some embodiments of the inventive subject matter.

FIG. 3 illustrates a processor 300 and memory 305 that may be used in embodiments of data processing systems, such as the DMS 114 processor of FIG. 1 and the data processing system 200 of FIG. 2, respectively, for detecting sustained oscillation events based on synchronous frequency measurements, in accordance with some embodiments of the inventive subject matter. The processor 300 communicates with the memory 305 via an address/data bus 310. The processor 300 may be, for example, a commercially available or custom microprocessor. The memory 305 is representative of the one or more memory devices containing the software and data used for detecting sustained oscillation events based on synchronous frequency measurements in accordance with some embodiments of the inventive subject matter. The memory 305 may include, but is not limited to, the following types of devices: cache, ROM, PROM, EPROM, EEPROM, flash, SRAM, and DRAM.

As shown in FIG. 3, the memory 305 may contain two or more categories of software and/or data: an operating system 315 and a sustained oscillation detection module 320. In particular, the operating system 315 may manage the data processing system's software and/or hardware resources and may coordinate execution of programs by the processor 300. The sustained oscillation detection module 320 may comprise a PMU data collection module 325, a phase angle curve generation module 330, an envelope analysis module 335, an event detection module 340, an alert module 345, a data module 350, and a communication module 355.

The PMU data collection module 325 may be configured to receive measured information, such as, for example, time-stamped power system frequency measurements from the PMUs 118a, 118b, and 118c in the distribution grid 110.

The phase angle curve generation module 330 may be configured to extract phase angle measurements from the power system frequency measurements received from the PMUs 118a, 118b, and 118c and generate a phase angle curve over a time interval.

The envelope analysis module 335 may be configured to process the phase angle curve generated by the phase angle curve generation module 330 to evaluate the envelope of the phase angle curve. In some embodiments, the envelope of the phase angle curve may be processed to determine if the envelope expresses one or more signature characteristics that may be indicative of a sustained oscillation event. For example, the signatures that may be indicative of a sustained oscillation event may include, but are not limited to, 1) a generally large magnitude, 2) generally poor damping, and 3) a generally long-lasting duration.

The event detection module 340 may be configured to define the thresholds that are used as benchmarks for the signature analysis performed by the envelope analysis module 335 and may recognize the occurrence or non-occurrence of a sustained oscillation event based on the analysis output from the envelope analysis module 335.

The alert module 345 may be configured to generate an alert or notification to the appropriate supervisory authority for the main power grid 102 by way of the DMS 114. The alert or notification may further trigger an automated or manual change in the assignment of a power generator to a load in the power system based on the detected sustained oscillation event, including, for example, an increase or decrease in the output of the power generator.

The data module 350 may represent the power system frequency measurements from the PMUs 118a, 118b, and 118c and received by the PMU data collection module 325, the thresholds used by the envelope analysis module 335, and other data structures used by the sustained oscillation detection module 320 for detecting sustained oscillation events based on synchronous frequency measurements obtained from one or more PMUs 118a, 118b, and 118c.

The communication module 355 may be configured to facilitate communication between the DMS 114 processor and the PMUs 118a, 118b, and 118c of FIG. 1 over the network 120 and to facilitate communication of an alert or notification to the appropriate supervisory authority over one or more wired or wireless networks upon detection of a sustained oscillation event Although FIG. 3 illustrates hardware/software architectures that may be used in data processing systems, such as the DMS 114 processor of FIG. 1 and the data processing system 200 of FIG. 2, respectively, for detecting sustained oscillation events based on synchronous frequency measurements obtained from one or more PMUs 118a, 118b, and 118c, in accordance with some embodiments of the inventive subject matter it will be understood that the present invention is not limited to such a configuration but is intended to encompass any configuration capable of carrying out operations described herein.

Computer program code for carrying out operations of data processing systems discussed above with respect to FIGS. 1-3 may be written in a high-level programming language, such as Python, Java, C, and/or C++, for development convenience. In addition, computer program code for carrying out operations of the present invention may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller.

Moreover, the functionality of the DMS 114 processor of FIG. 1, the data processing system 200 of FIG. 2, and the hardware/software architecture of FIG. 3, may each be implemented as a single processor system, a multi-processor system, a multi-core processor system, or even a network of stand-alone computer systems, in accordance with various embodiments of the inventive subject matter. Each of these processor/computer systems may be referred to as a "processor" or "data processing system."

The data processing apparatus of FIGS. 1-3 may be used to facilitate the detection of sustained oscillation events based on synchronous frequency measurements obtained from one or more PMUs 118a, 118b, and 118c, according to various embodiments described herein. These apparatus may be embodied as one or more enterprise, application, personal, pervasive and/or embedded computer systems and/or apparatus that are operable to receive, transmit, process and store data using any suitable combination of software, firmware and/or hardware and that may be stand-alone or interconnected by any public and/or private, real and/or virtual, wired and/or wireless network including all or a portion of the global communication network known as the Internet, and may include various types of tangible, non-transitory computer readable media. In particular, the memory 206 coupled to the processor 208 and the memory 305 coupled to the processor 300 include computer readable program code that, when executed by the respective processors, causes the respective processors to perform operations including one or more of the operations described herein with respect to FIGS. 4-14.

Embodiments of the inventive subject matter may provide a real-time and robust approach for detecting sustained oscillations in power grids based on PMU measurements. A power system response may be represented as the superposition of three components: ambient, transient, and forced. If the power system is only excited by low-amplitude arbitrary variations, typically as random load variations, the response is assumed to be ambient. The transient response is typically caused by a sudden trip, such as the loss of power supply or demand, or a fault, such as a short circuit of the transmission line. The forced response may correspond to a cyclic input and is superimposed with the other two responses.

Power system dynamics properties are typically analyzed via linearization of the dynamics of an operation condition. The linearized state equation of a power system can be described as Equation 1:

$$\dot{x}(t) = Ax(t) + b_1 f(t) + \Sigma_{k=1}^{M} b_{2k} q_k(t) \quad (1)$$

where A is the state matrix. x(t) is system state vector including machine rotor angles and velocities, t is time, and N is the number of system states; Ax(t) is the response to zero-state; f(t) is a periodical system petulance exciting a forced oscillation; $q_k(t)$ is a random stationary zero-mean white Gaussian noise independent source, which is typically conceptualized as noise produced by random load switching. The overall system response, therefore, has three components: 1) the transient response caused by the initial state; 2) the forced response caused by f(t); and 3) the random response caused by white noise.

Assume the forced input f(t) given by Equation 2 is zero-mean and periodical at frequency $w_0$:

$$f(t) = \Sigma_{m=1}^{\infty} 2|A_m| \cos(m w_0 t + \angle A_m) \quad (2)$$

where $A_m = A^*_{-m}$ and $A_o = 0$. If f(t) is inserted into Equation 1, the solution of Equation 1 is given by Equation 3:

$$x(t) = [\Sigma_{i=0}^{N} u_i v_i x(0) e^{\lambda_i t}] \rightarrow \text{Transient response}$$

$$+ \Sigma_{m=-\infty}^{\infty} [[\Sigma_{i=1}^{N} u_i v_i b_1 e^{\lambda_i t}] \circledast A_m e^{jmw_0 t}] \rightarrow \text{Forced response}$$

$$+ \Sigma_{k=1}^{M} [\Sigma_{i=1}^{N} u_i v_i b_{2k} e^{\lambda_i t}] \circledast q_k(t) \rightarrow \text{Arbitrary response} \quad (3)$$

where $\lambda_i$ is the ith eigenvalue (i=1, . . . , N); $u_i$ is the ith right eigenvector; $v_i$ is the ith left eigenvector; $\circledast$ is convolution operator, and $j = \sqrt{-1}$. The first term is the transient response, the second term is the forced response, and the third is the noise response. If the forced input f(t) is zero and a given system mode is zero or weakly damped, the natural oscillation is sustained. If the cyclic input is non-zero, and the system is asymptotically stable, the response is a forced oscillation.

Furthermore, when an inter-area mode is poorly damped, and a forced disturbance is injected at a frequency close to the system mode at a location where the inter-area mode is strong, a resonance may occur, which may lead to a sustained oscillation that has a much larger magnitude than the input. Regardless of whether forced oscillations are driven by cyclic disturbances, or resonance between system mode and external disturbances, or poorly damped low-frequency oscillation, their frequency responses generally have the same characteristics: 1) generally weak or negative damping; 2) generally long-lasting; and 3) generally large oscillation magnitude. The sustained oscillatory power output may threaten stable operation of the power system.

Power spectral density (PSD) of a stationary random signal x(n) is mathematically related to the autocorrelation sequence by the discrete-time Fourier transform. In terms of normalized frequency. It is given by Equation 4:

$$P_{xx}(w) = \frac{1}{2\pi} \sum_{m=-\infty}^{\infty} R_{xx}(m) e^{-jwm} \quad (4)$$

where $R_{xx}(m)$ is the autocorrelation sequence given by Equation 5:

$$R_{xx}(m) = E\{x^*(n)x(n+m)\} -\infty < n < \infty \quad (5)$$

where x(n) and m are a stationary random signal and a time lag respectively. The superscript "*" represents a complex conjugate operation and $E\{\cdot\}$ is the expected value operator. PSD is expressed in units of power per radian (watt/radian). If PSD is converted on the logarithmic scale, the unit is written as dB/Hz.

Assuming the PSD is to be estimated from D most recent samples, and K is the current sample, then an estimate of PSD is achieved by removing the limit and expectation operators. This results in a definition of periodogram as given by Equation 6:

$$P_{xx}(w_m) = \frac{1}{D} \left| \sum_{k=K-D+1}^{K} R_{xx}(k) e^{-jw_m(k-K+D)} \right|^2 \quad (6)$$

where $$w_m = \frac{2\pi m}{D},$$

$w \in [0, \pi]$ is the sampled version of the angular frequency. The periodogram may be a simple estimator of the PSD. Though it may be considered a poor estimator of a random signal's frequency content, periodograms are often used to detect deterministic sinusoids in noise. The periodogram of a given forced oscillation may be indicative of paramount energy at the oscillation frequency.

Figure 4:
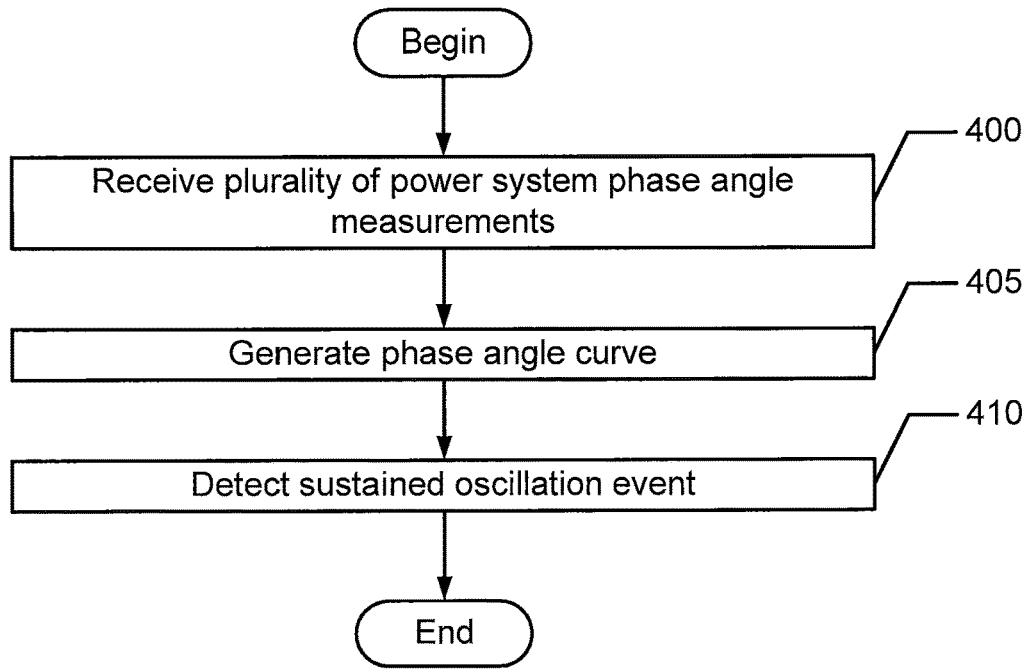
FIGS. 4-7 are flowcharts that illustrate operations for detecting sustained oscillations in a power system in accordance with some embodiments of the inventive concept.

FIG. 4 is a flowchart that illustrates operations for detecting sustained oscillation events based on synchronous frequency measurements obtained from one or more PMUs 118a, 118b, and 118c in accordance with some embodiments of the inventive subject matter. Operations begin at block 400 where the DMS 114 receives a plurality of power system frequency measurements from the PMUs 118a, 118b, and/or 118c. It will be understood that while only three PMUs are illustrated in FIG. 1, fewer or more PMUs may be used in accordance with various embodiments of the inventive subject matter. At block 405, the phase angle curve generation module 330 generates the phase angle curve over a time interval based on the power system phase angle measurements obtained from the PMUs 118a, 118b, and/or 118c. The event detection module 340 in cooperation with the envelope analysis module 335 detects a sustained oscillation event at block 410 in a power signal based on an envelope of the phase angle curve.

Figure 5:
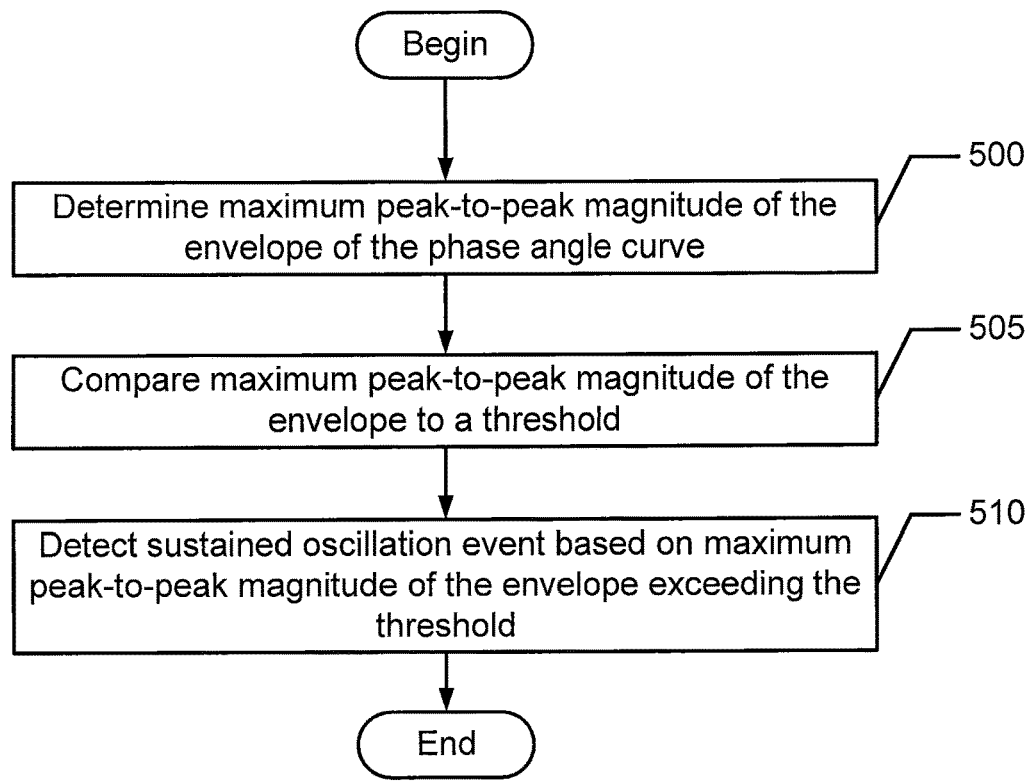

In some embodiments, the event detection module 340 in cooperation with the envelope analysis module 335 detects a sustained oscillation event based on a magnitude of the envelope of the phase angle curve. Referring to FIG. 5, operations begin at block 500 where the envelope analysis module 335 determines a maximum peak-to-peak magnitude of the envelope of the phase angle curve. The maximum peak-to-peak magnitude of the envelope is compared to a threshold at block 505 and the event detection module 340 in cooperation with the envelope analysis module 335 detects a sustained oscillation event based on the maximum peak-to-peak magnitude of the envelope exceeding the threshold at block 510. In some embodiments, a sustained oscillation event may only be detected or recognized when the peak-to-peak magnitude of the envelope exceeds the threshold for a minimum time duration threshold, which may be, for example, about two minutes.

Figure 6:
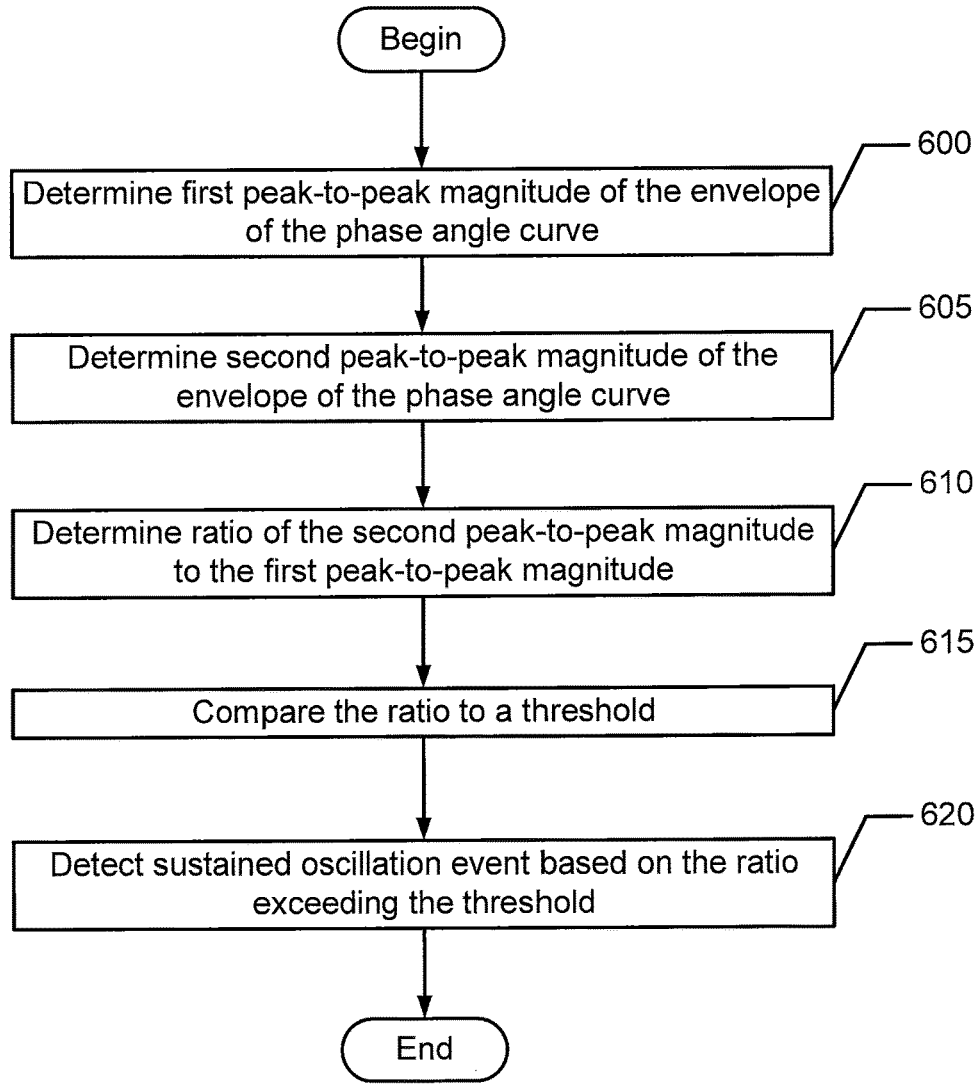
Figure 12:
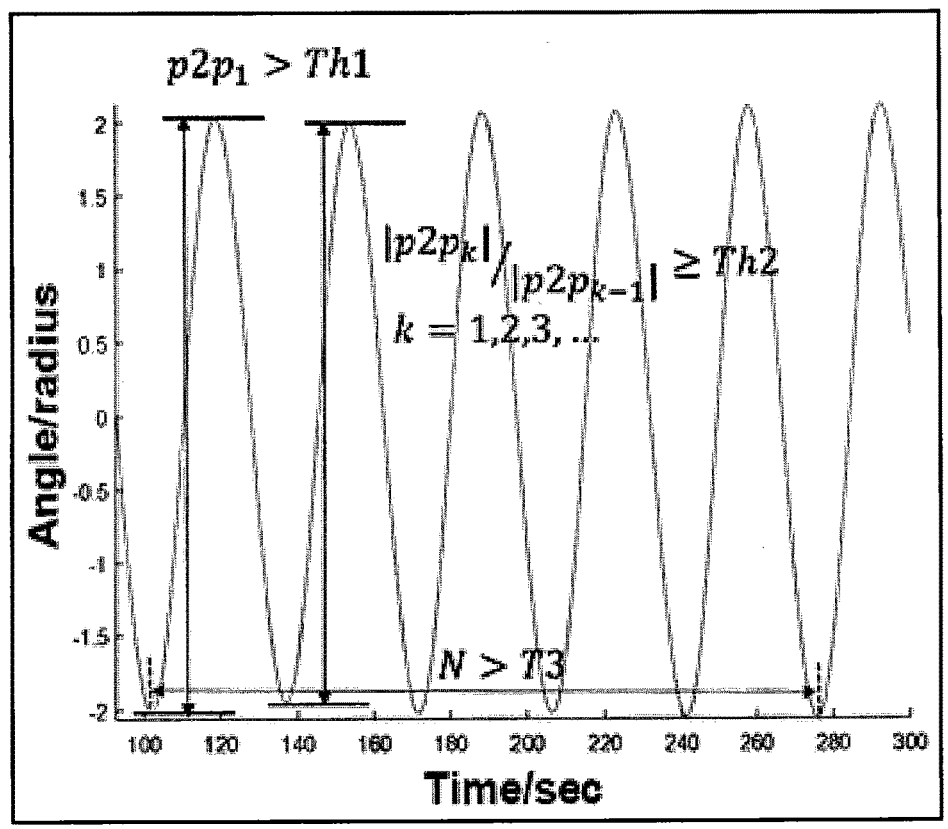
FIG. 12 is a graph that illustrates explication of criteria used for sustained oscillation detection based on the synchrophasor measurements in accordance with some embodiments of the inventive subject matter.

In some embodiments, the event detection module 340 in cooperation with the envelope analysis module 335 detects a sustained oscillation event based on a damping of the envelope of the phase angle curve. Referring to FIG. 6, operations begin at block 600 where the envelope analysis module 335 determines a first peak-to-peak magnitude of the envelope of the phase angle curve for a first cycle of the phase angle curve. In some embodiments, operations for detecting a sustained oscillation proceed only when the first peak-to-peak magnitude exceeds a defined threshold (FIG. 12, Th1). In other embodiments, operations for detecting a sustained oscillation proceed only when the first peak-to-peak magnitude exceeds the defined threshold for a defined time duration threshold (FIG. 12, T3). At block 605, the envelope analysis module 335 determines a second peak-to-peak magnitude of the envelope of the phase angle curve for a second cycle of the phase angle curve, which occurs at a later time than the first cycle. A ratio of the second peak-to-peak magnitude to the first peak-to-peak magnitude is determined at block 610 and the ratio is compared to a threshold at block 615. The event detection module 340 in cooperation with the envelope analysis module 335 detects a sustained oscillation event at block 620 based on the ratio exceeding the threshold.

Figure 7:
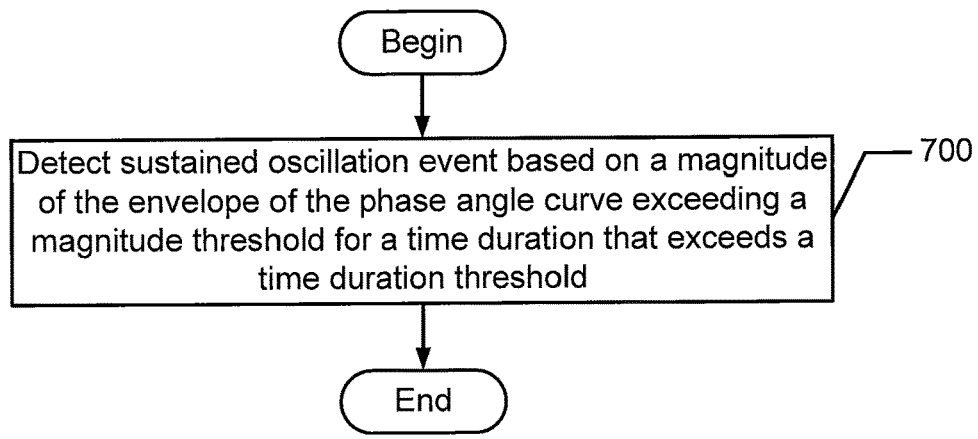

In some embodiments, the event detection module 340 in cooperation with the envelope analysis module 335 detects a sustained oscillation event based on oscillation duration. Referring to FIG. 7, operations begin at block 700 where the event detection module 340 in cooperation with the envelope analysis module 335 detects a sustained oscillation event based on a magnitude of the envelope of the phase angle curve exceeding a magnitude threshold for a time duration that exceeds a time duration threshold. In some embodiments of the inventive subject matter, the magnitude threshold may be defined by determining a probability density function of the magnitude, e.g., peak-to-peak magnitude of the envelope of the phase angle curve. The magnitude threshold may correspond to a peak-to-peak magnitude value of the envelope of the phase angle curve that is greater than other peak-to-peak magnitude values of the envelope of the phase angle curve with a probability of about 99.5%.

Thus, embodiments of the inventive subject matter may detect sustained oscillations based on one or more of the magnitude of an envelope of the phase angle curve, a damping characteristic of the envelope of the phase angle curve, and a duration of the envelope of the phase angle curve having a magnitude above a threshold.

In response to the detection of a sustained oscillation event, the alert module 345 may generate an alert or notification to the appropriate supervisory authority for the main power grid 102 by way of the DMS 114.

Figure 8:
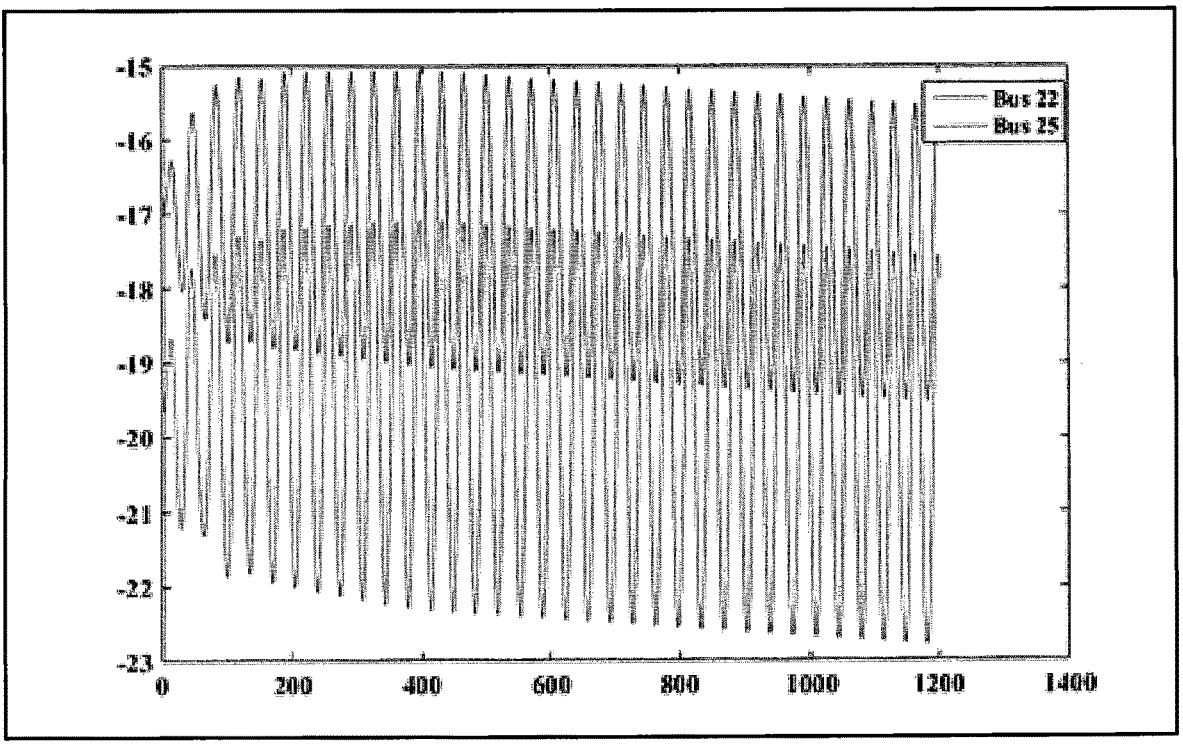
FIGS. 8 and 9 are graphical representations illustrating angle responses to a forced oscillation simulation and a poorly damped oscillation simulation in accordance with some embodiments of the inventive subject matter.
Figure 9:
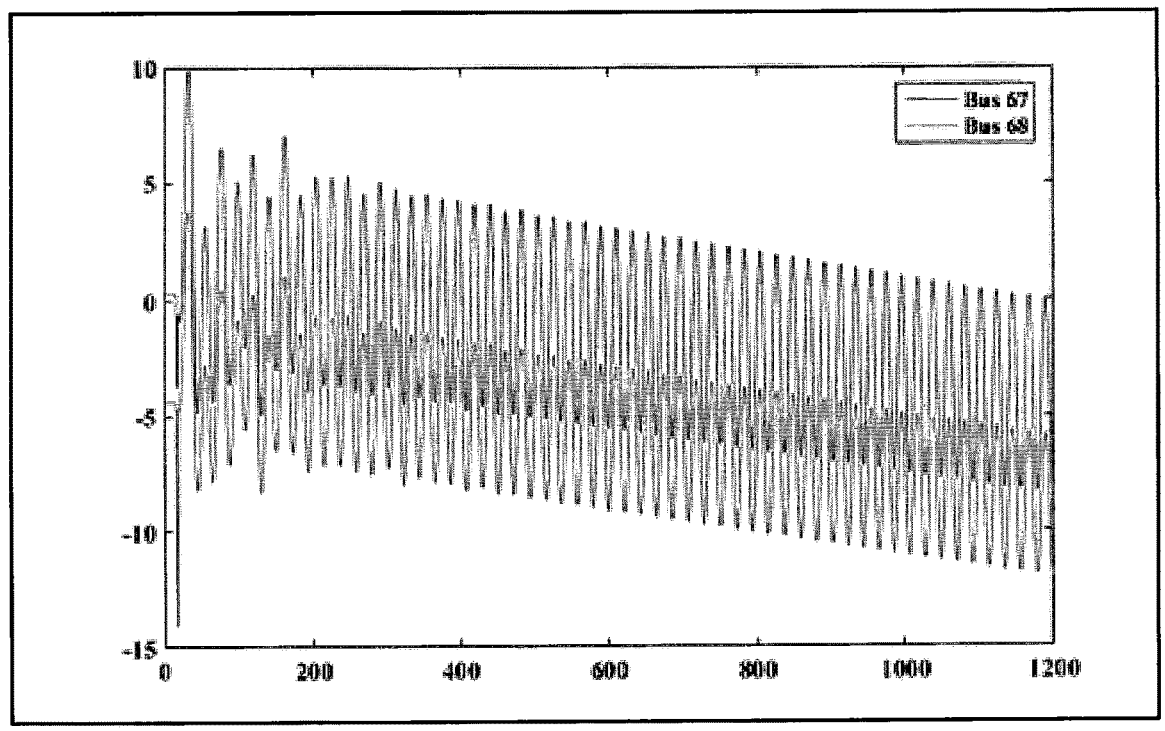

Embodiments of the inventive subject matter may be illustrated by way of example. Poorly damped oscillations and forced oscillations in a reduced WECC 179-bus, 29-machine system have been simulated. FIGS. 8 and 9 present the angle responses to a forced oscillation case and a poorly damped oscillation case simulated in the Department of Electrical Engineering and Computer Science at the University of Tennessee Knoxville. The power system has a natural mode at 0.86 Hz. FIG. 8 shows the bus voltage angle at bus 22 and bus 25 when there is a forced oscillation injected into the excitation system of generator four as a sinusoid signal with a frequency 0.86 Hz to cause resonance. The largest peak to peak active power output is about 175 MW. FIG. 9 presents the voltage angle of bus 67 and 68 when a local mode has a low damping, and a three-phase short circuit is added at bus 159 and cleared 0.05 seconds after. The low damped oscillation was initialized at a different bus from the circuit.

According to the voltage angle trajectories in the simulation results, three common characteristics can be concluded: 1) generally large magnitude; 2) generally poor damping; and 3) generally long durations. Once concern of sustained oscillation is its long-lasting and poor damping characteristics. The magnitude may not necessarily be very large, but in some cases may be sufficiently large to merit an operator's or administrator's attention. In addition to simulation of sustained oscillations, measurements of real sustained oscillation events are analyzed to verify that they can be identified by one or more of the magnitude, damping, and duration signatures.

Figure 10:
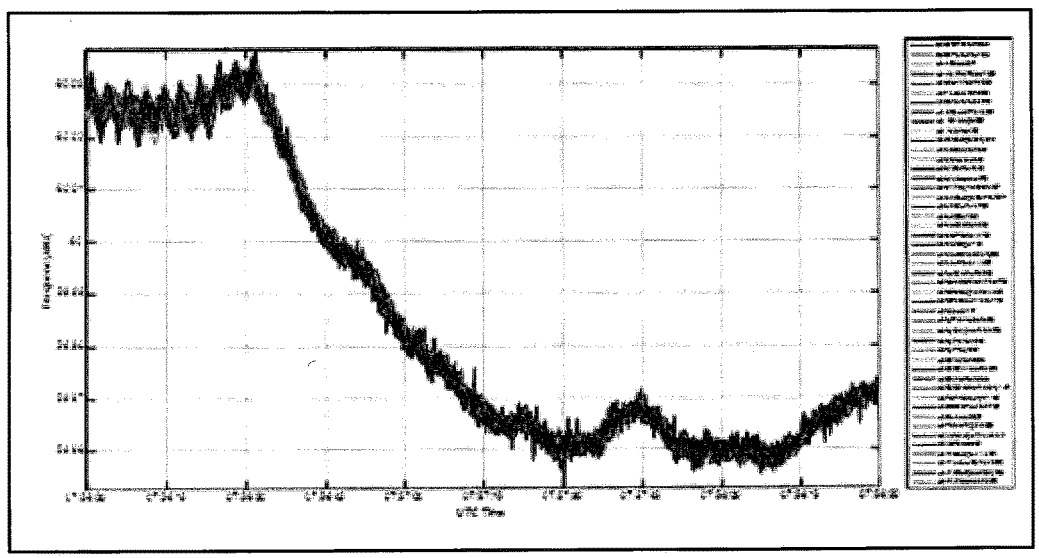
FIG. 10 is a graphical representation illustrating the angle response for a simulation based on low damping in response to a short circuit in accordance with some embodiments of the inventive subject matter.

A nuclear unit in Eastern Interconnection grid was running at 700 MW prior to its trip around 08:00 am UTC time. According to the synchrophasor measurements at FNET/GridEye, its frequency response is shown in FIG. 10. In FIG. 10, each curve is made from the measurements of an individual FDR installed in Eastern Interconnection. Because of the synchronism of system frequency, and there are over 100 available FDRs in this figure, the curves are intertwined together. It can be seen that, around 07:56:32 UTC time, the frequency started to decline quickly, which represents the occurrence of the unit trip. The frequency drops from 60.03 Hz to 59.96 Hz within 1 minute. The slope of the frequency decline during this period is about 1.1 mHz/s, which is much smaller than normal generation trip events detected at FNET/GridEye, which is typically around 3 mHz/s. It is possible that this event is a controlled shutdown or runback. Certain controls are conducted to suppress extreme frequency deviations. An interesting frequency response is observed before the trip. There is noticeable oscillation on several FDRs. Therefore, the FDRs frequency measurements before this unit trip are analyzed, and several sustained oscillations are discovered. The oscillations are described below.

Figure 11:
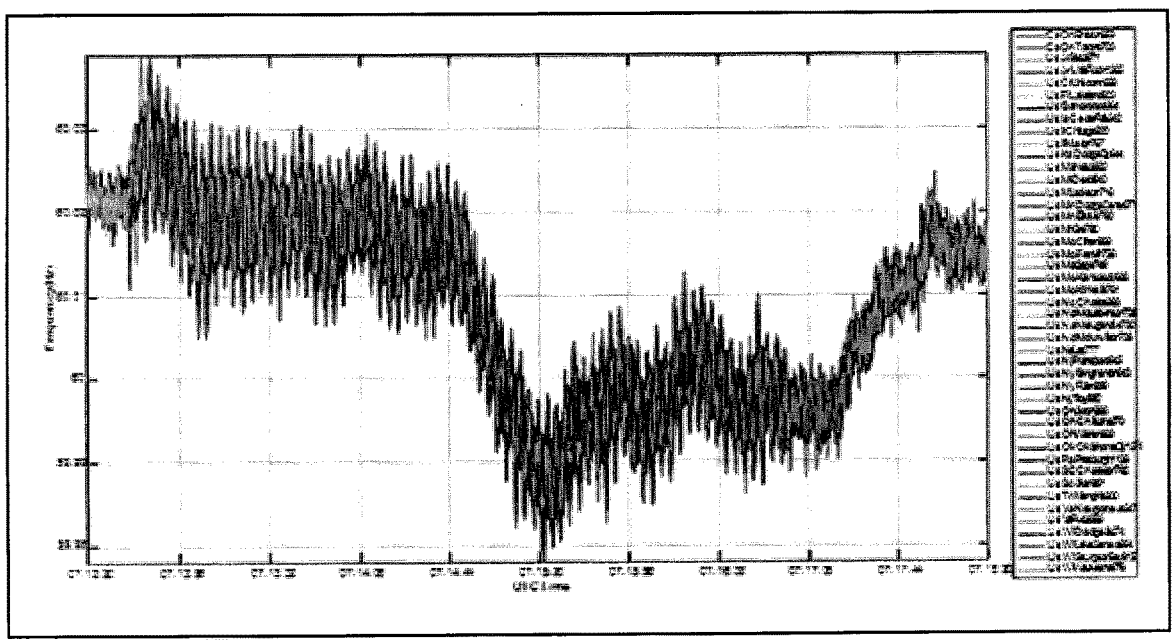
FIG. 11 is a graphical representation of a period of sustained oscillation in accordance with some embodiments of the inventive subject matter.

There are three periods of sustained oscillation discovered: One example is shown in FIG. 11. The frequency measurements of the same FDRs as in FIG. 10 are displayed. The curves are intertwined with each other. As shown in FIG. 11, a large magnitude and poor-damping oscillation event was initiated at 07:12:40, and lasted about 5 minutes until 07:17:05. By mode analysis on this period of frequency using a Matrix Pencil method, which is a typical method for oscillation mode analysis, revealed the dominant oscillations mode is 0.2739 Hz. Therefore, it can be seen that in realistic synchrophasor monitoring, the frequency measurements perform the same three characteristics as in simulations: 1) generally large magnitude, 2) generally poor damping, and 3) generally long duration.

In the context of sustained oscillation signatures described above, FIG. 12 illustrates explication of the criteria of the sustained oscillation detection based on the synchrophasor measurements. First, the signal performs periodicity with a dominant frequency. Therefore, the detection of a peak-to-peak value higher than a predefined threshold may represent a large magnitude. The second criterion is the poor or negative damping. A mode analysis may be used to determine the damping ratio. However, the mode analysis may require significant computing resources and time to be executed in real-time mode and, consequently, may not be suitable for real-time applications and analysis. Therefore a phase angle envelope approach is applied to determine low damping ratio events. The damping may be considered as poor if the envelope of the oscillation shows that the magnitude ratio between adjacent cycles is high. The third characteristic is that the oscillation long-lasting. Thus, if the poorly damped wavelet lasts for a long enough time, it may be recognized as a sustained oscillation.

Figure 13:
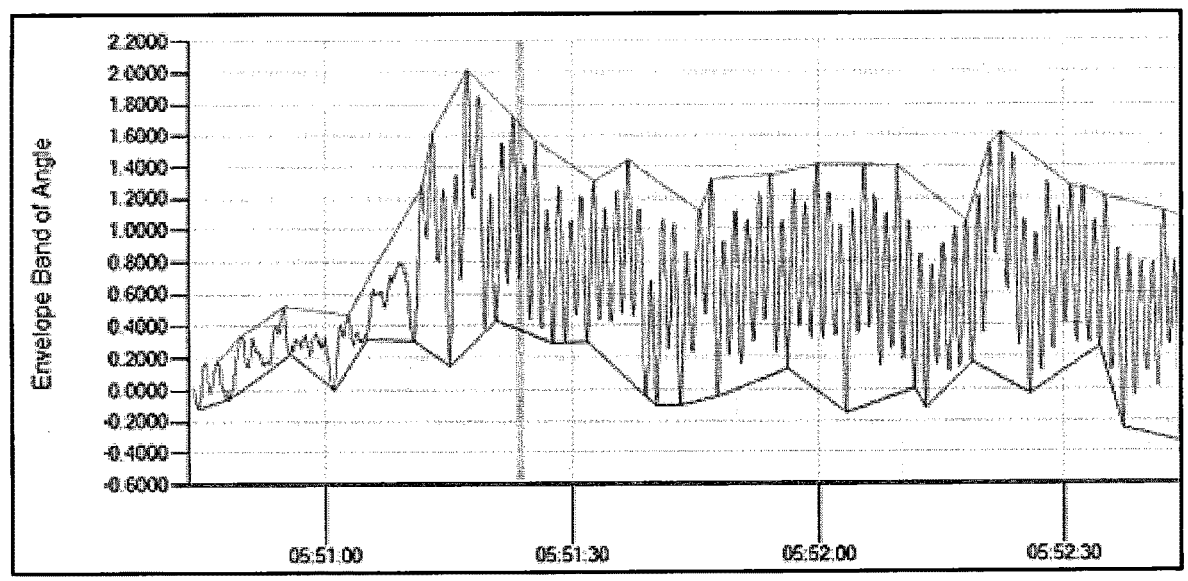
FIG. 13 is a graph that illustrates analysis of the envelope band for phase angle information obtained from synchrophasor measurements for detecting sustained oscillation in accordance with some embodiments of the inventive subject matter.
Figure 14:
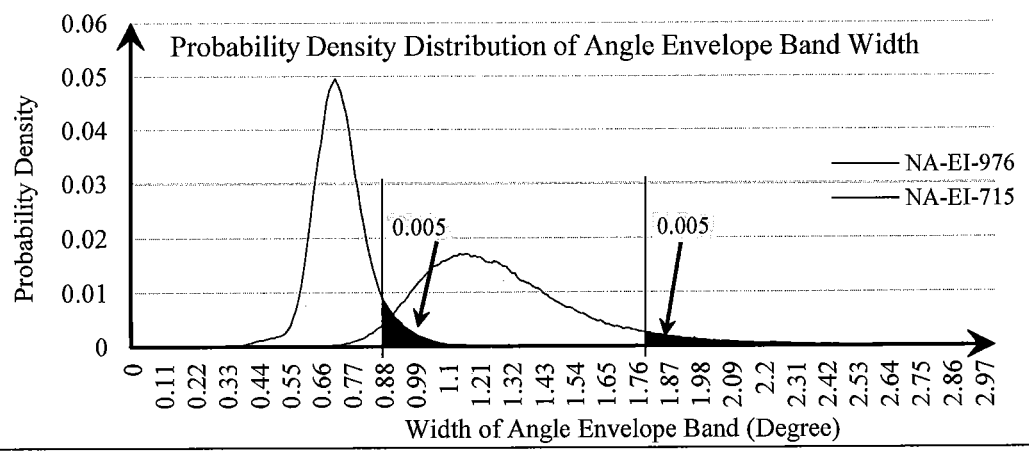
FIG. 14 is a graph of a probability density distribution for the envelope band width of FIG. 13 for determining a band width magnitude threshold for use in determining whether an oscillation has a long duration indicative of a sustained oscillation.

As described above, an envelope band analysis may be applied to the angle data stream, as shown in FIG. 13, to get the upper/lower envelope line by connecting local maxima/minima of the data stream. The band width is then calculated to estimate the oscillation magnitude. Because the typical oscillation magnitude is different in different areas, different thresholds may be applied to different areas. To determine a proper threshold for a specific area, in some embodiments, a real-time statistics technique is applied to the data stream of the area to dynamically get the probability distribution of the angle envelope band width. Then the threshold is set to a value such that the probability of envelope band width larger than the value is 0.005, as shown in FIG. 14. If the envelope band width stays larger than the threshold for a certain time it will be recognized as a long duration oscillation, and indicative of a sustained oscillation.

Embodiments of the inventive subject matter may provide a synchrophasor measurement-based method for detecting sustained oscillations in real-time. It may improve the operational stability of power systems by providing improved situational awareness through the generation of alerts notifying operational personnel of a sustained oscillation event. Moreover, these alerts may be used to trigger an automated mitigation process to adjust the output of one or more power generators and/or their load assignments. The synchrophasor analysis may be based on a phase angle curve envelope that is used to search for signatures that are characteristic of sustained oscillation events. Moreover, the envelope may be used to determine one or more thresholds used as benchmarks to determine if a pattern corresponds to a sustained oscillation signature.

Further Definitions and Embodiments:

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, LabVIEW, dynamic programming languages, such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present disclosure of embodiments has been presented for purposes of illustration and description, but is not intended to be exhaustive or limited to the disclosure in the form disclosed. Many variations and modifications can be made to the embodiments without substantially departing from the principles of the present invention. All such variations and modifications are intended to be included herein within the scope of the present invention.

What is claimed is:

1. A method comprising:
   performing by a processor:
   receiving a plurality of power system phase angle measurements over a time interval from a plurality of phasor measurement units (PMUs) in a power system;
   generating a phase angle curve over the time interval based on the plurality of power system phase angle measurements; and
   detecting a sustained oscillation event in a power signal generated by the power system based on an envelope of the phase angle curve.

2. The method of claim 1, wherein detecting the sustained oscillation event comprises:
   detecting the sustained oscillation event based on a magnitude of the envelope of the phase angle curve.

3. The method of claim 2, wherein detecting the sustained oscillation event based on the magnitude of the envelope of the phase angle curve comprises:
   determining a maximum peak-to-peak magnitude of the envelope of the phase angle curve;
   comparing the maximum peak-to-peak magnitude of the envelope of the phase angle curve to a threshold; and
   detecting the sustained oscillation event based on the maximum peak-to-peak magnitude of the envelope of the phase angle curve exceeding the threshold.

4. The method of claim 1, wherein detecting the sustained oscillation event comprises:
   detecting the sustained oscillation event based on a damping of the envelope of the phase angle curve.

5. The method of claim 4, wherein detecting the sustained oscillation event based on the damping of the envelope of the phase angle curve comprises:
   determining a first peak-to-peak magnitude of the envelope of the phase angle curve for a first cycle of the phase angle curve;
   determining a second peak-to-peak magnitude of the envelope of the phase angle curve for a second cycle of the phase angle curve occurring later in time than the first cycle of the phase angle curve;
   determining a ratio of the second peak-to-peak magnitude to the first peak-to-peak magnitude;
   comparing the ratio to a threshold; and
   detecting the sustained oscillation event based on the ratio exceeding the threshold.

6. The method of claim 1, wherein detecting the sustained oscillation event comprises:
   detecting the sustained oscillation event based on a magnitude of the envelope of the phase angle curve exceeding a magnitude threshold for a time duration that exceeds a time duration threshold.

7. The method of claim 6, wherein the method further comprises:
   determining a probability density function of the magnitude of the envelope of the phase angle curve;
   wherein the magnitude threshold corresponds to a magnitude value of the envelope of the phase angle curve that is greater than other magnitude values of the envelope of the phase angle curve with a probability of about 99.5%.

8. The method of claim 1, further comprising:
   adjusting an assignment of a power generator to a load in the power system based on the sustained oscillation event.

9. A system, comprising:
a processor; and
a memory coupled to the processor and comprising computer readable program code embodied in the memory that is executable by the processor to perform operations comprising:
receiving a plurality of power system phase angle measurements over a time interval from a plurality of phasor measurement units (PMUs) in a power system;
generating a phase angle curve over the time interval based on the plurality of power system phase angle measurements; and
detecting a sustained oscillation event in a power signal generated by the power system based on an envelope of the phase angle curve.

10. The system of claim 9, wherein detecting the sustained oscillation event comprises:
detecting the sustained oscillation event based on a magnitude of the envelope of the phase angle curve.

11. The system of claim 10, wherein detecting the sustained oscillation event based on the magnitude of the envelope of the phase angle curve comprises:
determining a maximum peak-to-peak magnitude of the envelope of the phase angle curve;
comparing the maximum peak-to-peak magnitude of the envelope of the phase angle curve to a threshold; and
detecting the sustained oscillation event based on the maximum peak-to-peak magnitude of the envelope of the phase angle curve exceeding the threshold.

12. The system of claim 9, wherein detecting the sustained oscillation event comprises:
detecting the sustained oscillation event based on a damping of the envelope of the phase angle curve.

13. The system of claim 12, wherein detecting the sustained oscillation event based on the damping of the envelope of the phase angle curve comprises:
determining a first peak-to-peak magnitude of the envelope of the phase angle curve for a first cycle of the phase angle curve;
determining a second peak-to-peak magnitude of the envelope of the phase angle curve for a second cycle of the phase angle curve occurring later in time than the first cycle of the phase angle curve;
determining a ratio of the second peak-to-peak magnitude to the first peak-to-peak magnitude;
comparing the ratio to a threshold; and
detecting the sustained oscillation event based on the ratio exceeding the threshold.

14. The system of claim 9, wherein detecting the sustained oscillation event comprises:
detecting the sustained oscillation event based on a magnitude of the envelope of the phase angle curve exceeding a magnitude threshold for a time duration that exceeds a time duration threshold.

15. The system of claim 9, wherein the operations further comprise:
adjusting an assignment of a power generator to a load in the power system based on the sustained oscillation event.

16. A computer program product, comprising:
a tangible computer readable storage medium comprising computer readable program code embodied in the medium that is executable by a processor to perform operations comprising:
receiving a plurality of power system phase angle measurements over a time interval from a plurality of phasor measurement units (PMUs) in a power system;
generating a phase angle curve over the time interval based on the plurality of power system phase angle measurements; and
detecting a sustained oscillation event in a power signal generated by the power system based on an envelope of the phase angle curve.

17. The computer program product of claim 16, wherein detecting the sustained oscillation event comprises:
detecting the sustained oscillation event based on a magnitude of the envelope of the phase angle curve.

18. The computer program product of claim 16, wherein detecting the sustained oscillation event comprises:
detecting the sustained oscillation event based on a damping of the envelope of the phase angle curve.

19. The computer program product of claim 16, wherein detecting the sustained oscillation event comprises:
detecting the sustained oscillation event based on a magnitude of the envelope of the phase angle curve exceeding a magnitude threshold for a time duration that exceeds a time duration threshold.

20. The computer program product of claim 16, wherein the operations further comprise:
adjusting an assignment of a power generator to a load in the power system based on the sustained oscillation event.

* * * * *